United States Patent
Ewanchuk et al.

(10) Patent No.: US 12,531,554 B2
(45) Date of Patent: Jan. 20, 2026

(54) ENHANCED SOLID STATE CIRCUIT BREAKER STRUCTURE

(71) Applicant: Raytheon Technologies Corporation, Farmington, CT (US)

(72) Inventors: Jeffrey Ewanchuk, Manchester, CT (US); Baljit Riar, Rocky Hill, CT (US); Xin Wu, Glastonbury, CT (US)

(73) Assignee: RTX CORPORATION, Farmington, CT (US)

( * ) Notice: Subject to any disclaimer, the term of this patent is extended or adjusted under 35 U.S.C. 154(b) by 237 days.

(21) Appl. No.: 18/114,645

(22) Filed: Feb. 27, 2023

(65) Prior Publication Data

US 2024/0291478 A1 Aug. 29, 2024

(51) Int. Cl.
*H03K 17/082* (2006.01)
*H01F 10/08* (2006.01)
(Continued)

(52) U.S. Cl.
CPC ......... *H03K 17/0822* (2013.01); *H01F 10/08* (2013.01); *H01F 17/04* (2013.01); *H01L 23/5227* (2013.01); *H01L 23/62* (2013.01); *H01L 23/642* (2013.01); *H01L 23/645* (2013.01); *H01L 24/46* (2013.01); *H01L 24/48* (2013.01); *H01L 24/49* (2013.01); *H01L 25/16* (2013.01); *H01L 2224/48137* (2013.01); *H01L 2924/1206* (2013.01); *H01L 2924/13091* (2013.01)

(58) Field of Classification Search
CPC ........... H01F 17/04; H01L 2924/13091; H01L 2924/31007; H01L 2924/13055; H01L 23/5227; H01L 23/645; H01L 23/62; H01L 23/642; H01L 24/49; H01L 24/46
See application file for complete search history.

(56) References Cited

U.S. PATENT DOCUMENTS 6,104,106 A 8/2000 Partridge
8,213,146 B2 7/2012 Katoh
(Continued)

FOREIGN PATENT DOCUMENTS

JP 2006042512 A 2/2006

OTHER PUBLICATIONS

Hongwei et al., "Package level integration of a monolithic buck converter power IC and bondwire magnetics", Power Semiconductor Devices&IC's (ISPSD), 2010 22nd International Symposium On, IEEE, Piscataway, NJ, USA, Jun. 6, 2010 (Jun. 6, 2010), pp. 51-54, XP031729157.

(Continued)

*Primary Examiner* — Alonzo Chambliss
(74) *Attorney, Agent, or Firm* — Getz Balich LLC

(57) ABSTRACT

A solid state circuit breaker structure and electronic switching circuit is provided. The solid state circuit breaker structure includes a power substrate, a power die, a plurality of bond wires, and a magnetic body. The power die is mounted on the power substrate. The bond wires extend outwardly from the power die. The magnetic body is attached to the power substrate and disposed to increase a magnetic field produced by a current flowing through the bond wires and thereby produce a first inductance that produces a decrease in an overvoltage at turn off of the power die.

10 Claims, 4 Drawing Sheets

(51) Int. Cl.
*H01F 17/04* (2006.01)
*H01L 23/00* (2006.01)
*H01L 23/522* (2006.01)
*H01L 23/62* (2006.01)
*H01L 23/64* (2006.01)
*H01L 25/16* (2023.01)

(56) References Cited

U.S. PATENT DOCUMENTS

| | | | |
|---|---|---|---|
| 9,607,953 B1 * | 3/2017 | Li | H01L 24/00 |
| 9,819,339 B2 | 11/2017 | Ma | |
| 10,205,405 B2 | 2/2019 | Cyr | |
| 10,587,257 B2 | 3/2020 | Cyr | |
| 11,296,054 B2 * | 4/2022 | Richter | H01L 25/072 |
| 2012/0018777 A1 | 1/2012 | Takizawa | |
| 2013/0056755 A1 * | 3/2013 | Hatai | H01L 23/645 257/77 |
| 2020/0176402 A1 | 6/2020 | Trang | |

OTHER PUBLICATIONS

Wang et al., "A Single-Drive SiC-JFET-SCM for Solid State Circuit Breaker in MVDC Distribution Networks", IEEE Transactions On Industrial Electronics, IEEE Service Center, Piscataway, NJ, USA, vol. 70, No. 11, Dec. 20, 2022 (Dec. 20, 2022), pp. 11121-11131, XP011940185.

Z. John Shen, "On-Chip Bondwire Inductor with Ferrite-Epoxy Coating: A Cost-Effective Approach to Realize Power Systems on Chip", Power Electronics Specialists Conference, 2007. PESC 2007. IEEE, Jan. 1, 2007 (Jan. 1, 2007), pp. 1599-1604, XP093168478.

EP Search Report for EP Patent Application No. 23218846.6 dated Jun. 10, 2024.

* cited by examiner

ENHANCED SOLID STATE CIRCUIT BREAKER STRUCTURE

This invention was made with Government support under Contract 80GRC020F0166 awarded by NASA. The Government has certain rights in this invention.

BACKGROUND OF THE INVENTION

1. Technical Field

The present disclosure relates to electrical switching devices in an electrical distribution system in general, and to solid state circuit breakers in particular.

2. Background Information

Solid state circuit breakers (SSCB) may be used to interrupt currents that build up during a fault event. SSCBs are desirable because they are able to switch on and off rapidly but they still require some amount of time. The time between fault detection and current interruption may be referred to as the "switching time" or "turn-off time" and may be characterized as follows:

$$t_{int} = \frac{i_{peak} - i_L}{\left(\frac{V}{L_{in}}\right)}$$

where $t_{int}$ is time between the fault detection and current interruption, $i_{peak}$ is the peak current, $i_L$ is the steady state or load current, V is the voltage, and Lin is the induction of the circuit current source inlet. Higher currents result in higher SSCB losses and produce more stored inductor energy that must be dissipated when the SSCB is turned off. A snubber circuit is a known method for discharging the inductive element. An "RC snubber" having a capacitor and a resistor is an example of a snubber circuit that is conventionally known. FIG. 1 illustrates an example of a conventional bidirectional SSCB that includes an RC snubber circuit and a transient voltage suppressor (TVS) in parallel with a pair of MOSFETS.

In some applications it is desirable to minimize the SSCB switching time. One method for minimizing the switching time is to minimize the gate resistance ($R_g$) of the MOS-gated semiconductor; i.e., $t_{int} \propto R_g \propto i_{peak}$. A small gate resistance can, however, lead to a high change in current as a function of time (i.e., di/dt) which, depending on the application, can lead to a large overvoltage in the SSCB that can be detrimental to the SSCB. A large overvoltage ($V_{over}$) can, in some instances be accommodated by a large snubber circuit ($V_{over} \propto 1/R_g$), but a sufficiently large snubber circuit may not be desirable or practical in certain applications.

What is needed is an SSCB structure that is configured to reduce an overvoltage resulting from a high change in current as a function of time (i.e., di/dt) during a SSCB turn off event.

SUMMARY

According to an aspect of the present disclosure, a solid state circuit breaker structure is provided that includes a power substrate, at least one power die, a plurality of bond wires, and at least one magnetic body. The at least one power die is mounted on the power substrate. The bond wires extend outwardly from the power die. The at least one magnetic body is attached to the power substrate and disposed to increase a magnetic field produced by a current flowing through the bond wires and thereby produce a first inductance that produces a decrease in an overvoltage at turn off of the power die.

In any of the aspects or embodiments described above and herein, the first inductance may be in series with a source terminal of the at least one power die.

In any of the aspects or embodiments described above and herein, the at least one power die may be a metal oxide semiconductor field effect transistor (MOSFET) having a gate terminal, a drain terminal, and a source terminal, and the source terminal of the at least one power die is the source terminal of the MOSFET.

In any of the aspects or embodiments described above and herein, the MOSFET may be a N-Channel enhancement type MOSFET.

In any of the aspects or embodiments described above and herein, the at least one power die may be an insulated gate bipolar transistor (IGBT) having a collector terminal, an emitter terminal, and a gate terminal, and the source terminal of the at least one power die is the collector terminal of the IGBT.

In any of the aspects or embodiments described above and herein, the plurality of bond wires may extend in close proximity to the at least one magnetic body without extending around the magnetic body.

In any of the aspects or embodiments described above and herein, the plurality of bond wires may extend at least one turn around the at least one magnetic body.

In any of the aspects or embodiments described above and herein, the at least one magnetic body may include at least one soft magnetic sheet.

In any of the aspects or embodiments described above and herein, the at least one magnetic body may have a relative permeability in the range of one to one hundred (CGS Units).

In any of the aspects or embodiments described above and herein, the at least one magnetic body may have a relative permeability in the range of sixty to ninety (CGS Units).

According to another aspect of the present disclosure, an electronic switching circuit is provided that includes at least one power die, a gate driver loop, a source current connection, a second inductance related to a magnetic field produced by a current flowing through the line of the gate driver loop connected to the source terminal, and at least one magnetic body. The at least one power die has a gate terminal, a source terminal, and a drain terminal, and the power die is switchable between an on state and an off state. The gate driver loop has a pulsed voltage source for driving the power die, and the gate driver loop is in communication with the gate terminal and the source terminal of the power die. The source current connection is in communication with the gate driver loop and with the source terminal through a line of the gate driver loop. The source current connection has a first inductance related to a change in the source current as a function of time during a switching period of time between the on state and the off state of the power die. The at least one magnetic body is disposed to increase the magnetic field produced by the current flowing through the line of the gate driver loop connected to the source terminal, and thereby increase the second inductance. The first and second inductances additively produce a decrease in an overvoltage of the power die produced during the switching period of time between the on state and the off state of the power die.

In any of the aspects or embodiments described above and herein, the gate driver loop may include a voltage clamp, and that voltage clamp may include a Zener diode.

In any of the aspects or embodiments described above and herein, the line of the gate driver loop connected to the source terminal may extend in close proximity to the at least one magnetic body without extending around the magnetic body.

In any of the aspects or embodiments described above and herein, the line of the gate driver loop connected to the source terminal may extend at least one turn around the at least one magnetic body.

In any of the aspects or embodiments described above and herein, the at least one magnetic body may include at least one soft magnetic sheet, or may include a plurality of soft magnetic sheets stacked together.

The foregoing features and elements may be combined in various combinations without exclusivity, unless expressly indicated otherwise. For example, aspects and/or embodiments of the present disclosure may include any one or more of the individual features or elements disclosed above and/or below alone or in any combination thereof. These features and elements as well as the operation thereof will become more apparent in light of the following description and the accompanying drawings. It should be understood, however, the following description and drawings are intended to be exemplary in nature and non-limiting.

DETAILED DESCRIPTION

The present disclosure is directed to an enhanced solid state circuit breaker (SSCB) structure 20 that may be utilized in an electronics package configured for use in a power distribution system. The power distribution system may be utilized in an aviation power system (e.g., an aviation hybrid electric power system) but the present disclosure is not limited to such an application. The enhanced SSCB structure 20 is configured to cause an interruption in electrical current in the event of a fault in the power system.

Figure 1:
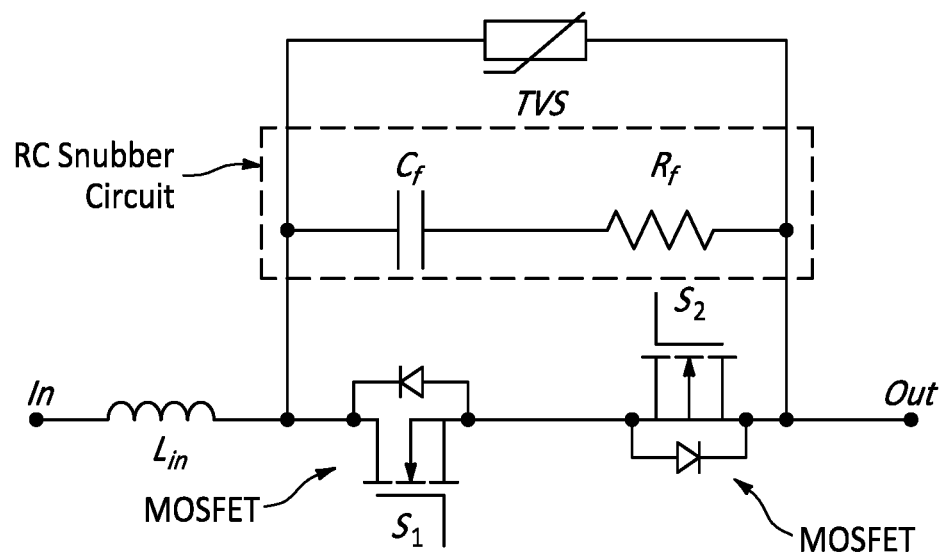
FIG. 1 is a diagrammatic solid state circuit breaker circuit.
Figure 2:
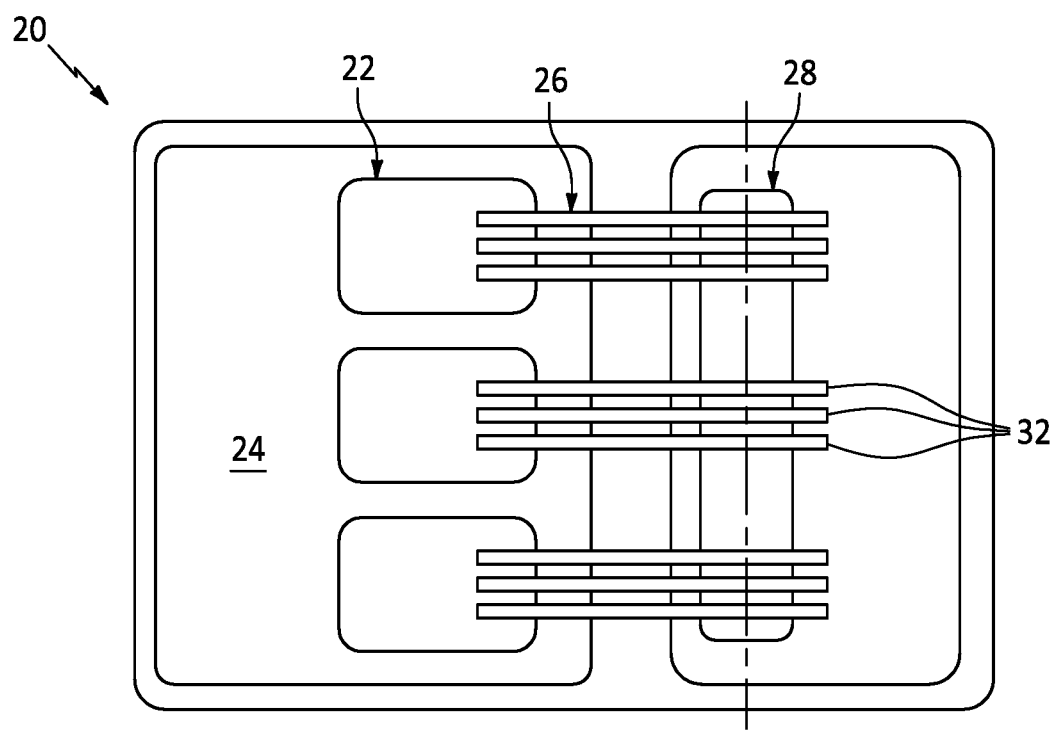
FIG. 2 is a diagrammatic top view of an embodiment of a present disclosure enhanced SSCB structure.
Figure 2A:
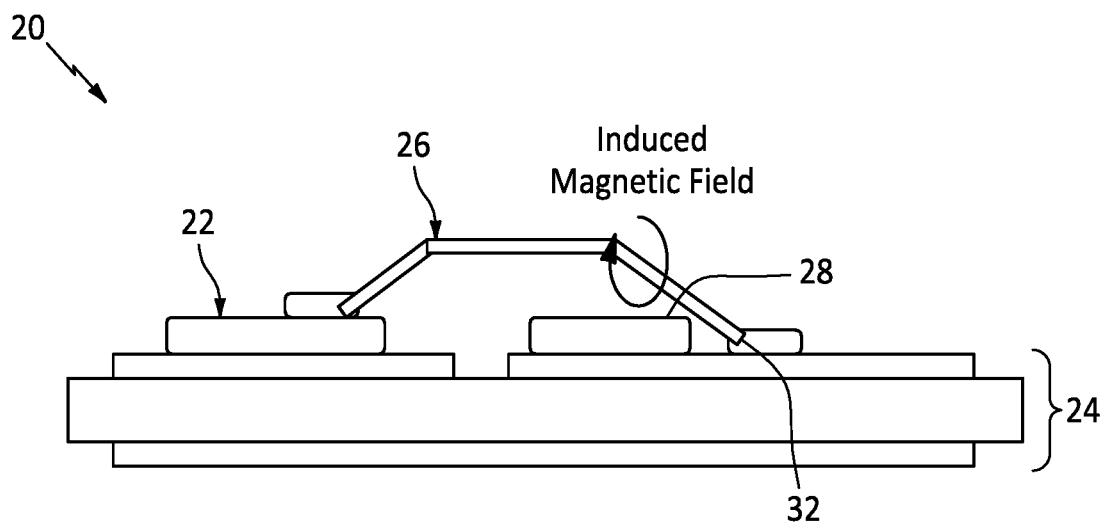
FIG. 2A is a diagrammatic end view of the enhanced SSCB structure embodiment shown in FIG. 2.
Figure 3:
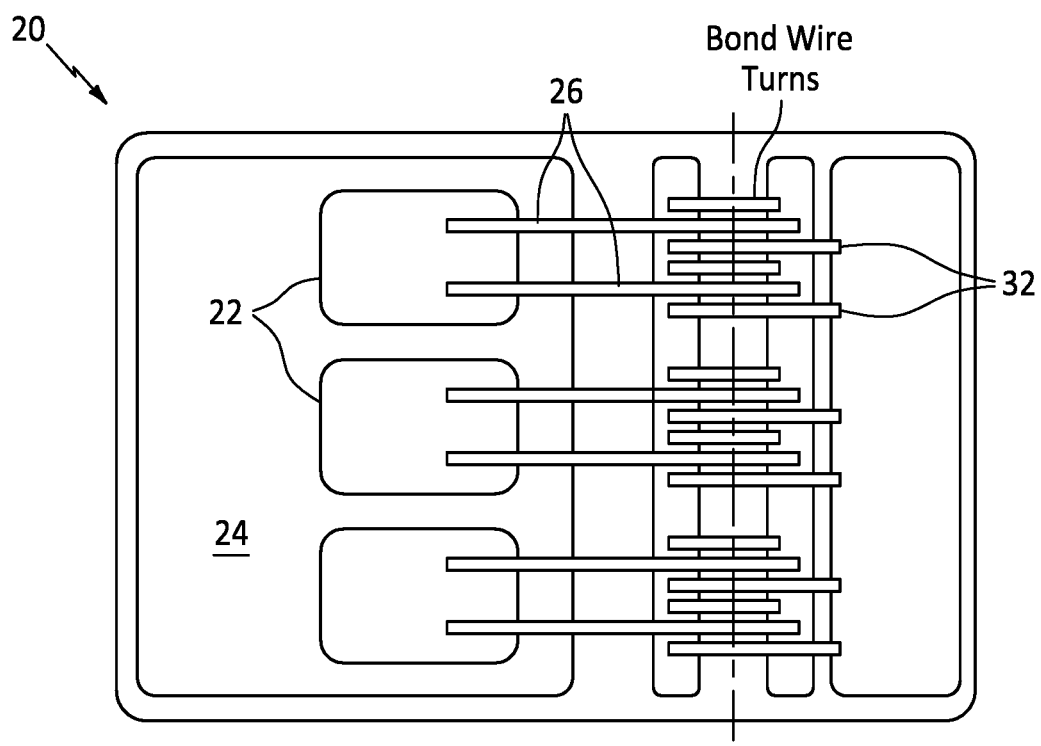
FIG. 3 is a diagrammatic top view of an embodiment of a present disclosure enhanced SSCB structure.

Referring to FIGS. 2, 2A, 3, the present disclosure enhanced SSCB structure 20 includes at least one power die 22 mounted on a power substrate 24 with a plurality of bond wires 26 extending out from the power die 22. A nonlimiting example of a power substrate is a directed bonded copper substrate having an alumina layer metalized on both sides with copper. Another nonlimiting example of a power substrate is a one that includes aluminum nitride metalized on both sides with copper. The present disclosure is not limited to any particular power substrate configuration. At least one magnetic body 28 is disposed in sufficient proximity to the bond wires 26 to increase the magnetic field produced by the current flowing through the bond wires 26. In some embodiments, the bond wires 26 may be disposed in proximity to the magnetic body 28 without a turn around the magnetic body 28. In some embodiments, the bond wires 26 may be formed to include one or more turns around the magnetic body 28. FIGS. 2 and 2A diagrammatically illustrate an enhanced SSCB structure embodiment that includes three (3) power dies mounted on a power substrate 24 with a plurality of bond wires 26 extending out from each power die 22. The magnetic body 28 is disposed in sufficient proximity to the bond wires 26 to increase the magnetic field produced by the current flowing through the bond wires 26. The embodiment shown in FIGS. 2 and 3 diagrammatically illustrates a single magnetic body 28 having a lengthwise extending axis 30. The present disclosure contemplates different magnetic body 28 configurations. For example, the at least one magnetic body 28 may be a single magnetic sheet, or it may be a plurality of magnetic sheets stacked together; e.g., all aligned on the lengthwise extending axis. As another example, an independent magnetic body 28 may be associated with a given power die 22, or more than one power die 22 may be associated with a particular magnetic body 28 while other power dies 22 may be associated with another magnetic body 28, and each of those magnetic bodies 28 may comprise a single magnetic sheet or a plurality of magnetic sheets. In short, each magnetic body 28 may be specifically configured for the power die 22 with which they are associated. In the example embodiment shown in FIG. 2, the bond wires 26 are disposed in proximity to the magnetic body 28 with their respective terminal ends 32 extending beyond the magnetic body 28 without a turn around the magnetic body 28. The term "turn" as used herein refers to a bond wire 26 path that encircles the magnetic body 28; e.g., circles around the body 28 and its lengthwise extending axis 30. FIG. 3 diagrammatically illustrates an enhanced SSCB structure 20 embodiment that includes three (3) power dies 22 mounted on a power substrate 24 with a plurality of bond wires 26 extending out from each power die 22. Each of the bond wires 26 includes at least one turn (FIG. 3 shows two turns) around the magnetic body 28 with the terminal end 32 of each bond wire 26 extending beyond the magnetic body 28. As stated above, each magnetic body 28 may be specifically configured for the power die 22 with which they are associated. The same holds true for the number of bond wire 26 magnetic body turns associated with each power die 22; e.g., the bond wires 26 off a first power die 22 may have one turn around the magnetic body 28, and the bond wires 26 off a second power die 22 may have more than one turn around the magnetic body 28. The enhanced SSCB structure 20 embodiments shown in FIGS. 2, 2A, and 3 are provided as nonlimiting examples to facilitate the description herein. For example, the choice of showing three power dies 22 in each SSCB structure embodiment 20 is arbitrary and the present disclosure is not limited thereto.

Figure 5:
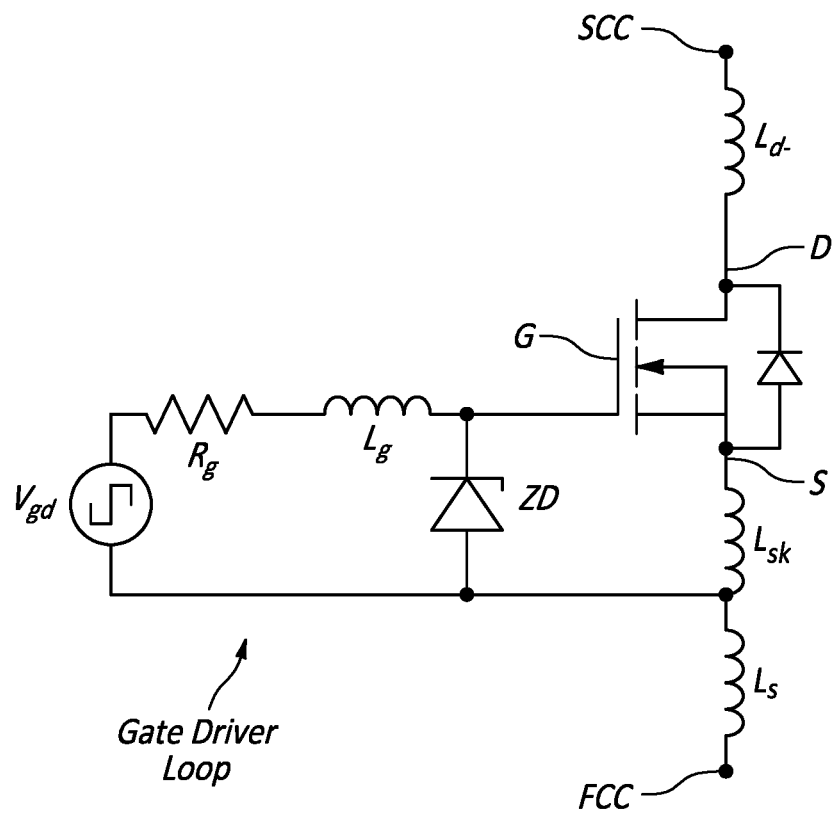
FIG. 5 is a diagrammatic circuit of an embodiment of a present disclosure SSCB structure.

The power dies 22 may be configured as metal oxide semiconductor field effect transistors (MOSFETs) each having a gate terminal (G), a drain terminal (D), and a source terminal (S; FIG. 5 illustrates the terminals). MOSFET construction is well known and therefore does not require additional description herein for enablement purposes. A nonlimiting example of an acceptable MOSFET is an N-channel enhancement type MOSFET. The present disclosure is not limited to N-channel enhancement type MOSFETs. In addition, embodiments of the present disclosure may use alternative type power dies such as an insulated-gate bipolar transistor (IGBT) having a collector, an emitter, and a gate.

As stated above, the magnetic body 28 is configured to increase the magnetic field produced by the current flowing through the bond wires 26. An example of an acceptable magnetic body 28 that may be used with the present disclosure is a soft magnetic sheet having a permeability greater than air (i.e., greater than 1). The soft magnetic sheet may have a relative permeability in the range of 1-100 (centimeter-gram-second or "CGS" units), which range includes low, medium, and high relative permeability values. The specific relative permeability for a soft magnetic sheet used within a present disclosure enhanced SSCB structure 20 may be selected to produce an inductance (as will be described herein) desirable for a selected application. For example, some applications may use a soft magnetic sheet having a high relative permeability (60-90), while others may use a soft magnetic body 28 having a medium relative permeability (20-50) or a low relative permeability (7-20). The aforesaid relative permeability ranges are for illustration purposes and the present disclosure is not limited thereto. Any magnetic body 28 that provides the functionality described herein may be used.

Figure 4:
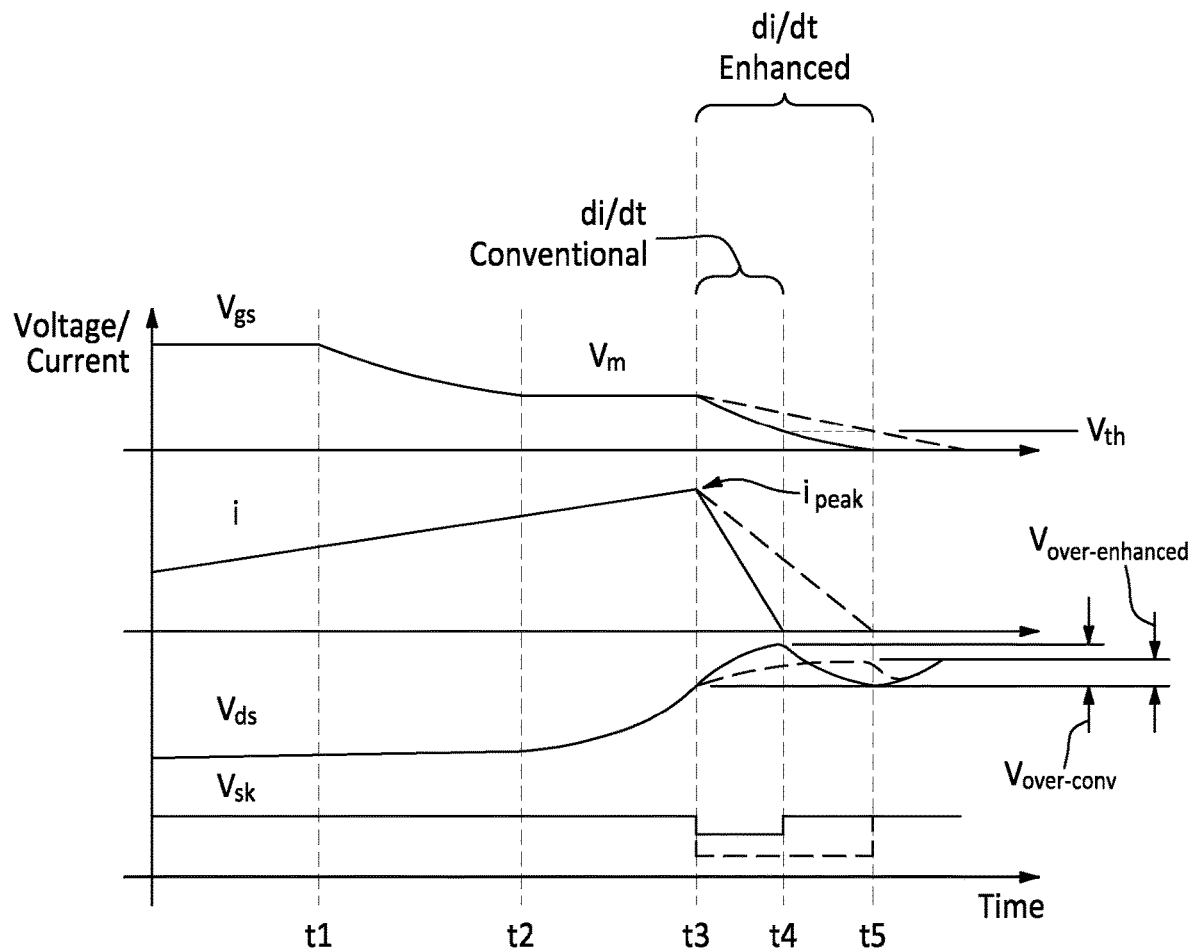
FIG. 4 is a graph of voltage and current versus time diagrammatically illustrating SSCB structure functionality.

The graph shown in FIG. 4 illustrates the functionality of the present disclosure enhanced SSCB structure 20 and the differences between it and a conventional SSCB structure (e.g., a SSCB structure without a magnetic body) they may be utilized in an electronics package configured for use in a power distribution system. FIG. 4 illustrates data for the voltage across the MOSFET gate ($V_{gs}$-"gate voltage"), the voltage across the MOSFET drain ($V_{ds}$-"drain voltage"), the voltage attributable to inductance ($V_{sk}$), and source current (i). The vertical axis of the graph represents the aforesaid voltages and current. The horizontal axis of the graph represents time. Hence, the graph diagrammatically illustrates voltage as a function of time and current as a function of time.

Prior to t1, the system is operating without a fault. At t1, the graph represents that a fault has been detected and a controller associated with the power die 22 has signaled the power die 22 to "break" the fault current. The switching function of the power die 22 is not instantaneous, however. It takes some amount of time to go from an "ON" state to an "OFF" state and that amount of time may be referred to as the "switching time" or "turn-off time". As a result of the control signal to break the fault current, the gate voltage ($V_{gs}$) begins to decrease between t1 and t2 (capacitive discharge of the power die). During this period of time, the fault current (i) continues to rise. At t2, the gate voltage ($V_{gs}$) reaches the Miller plateau voltage ($V_m$). Between t2 and t3 (the "Miller plateau"), the gate voltage ($V_{gs}$) is substantially constant, the drain voltage ($V_{ds}$) increases, and the fault current (i) continues to rise. At t3 (the end of the Miller plateau) the fault current (i) is at a peak value ($i_{peak}$). After the peak current value ($i_{peak}$) is reached, the fault current begins to decrease as a function of time (di/dt). As will be detailed below, the change in current as a function of time (di/dt) creates an inductance ($L_{di/dt}$) which can lead to an undesirable overvoltage ($V_{over}$) that, if large enough, can damage the power die.

In many applications, it is desirable to decrease the switching time of the power die 22 and thereby respond faster to the identified fault. A common technique for decreasing the switching time is to reduce the gate resistance ($R_g$). Reducing the gate resistance in a conventional MOSFET will increase the magnitude of the di/dt and therefore the overvoltage ($V_{over}$).

As indicated above, the graph shown in FIG. 4 illustrates the functionalities of the present disclosure enhanced SSCB structure and a conventional SSCB structure. The waveforms of both structures are the same in time periods t1-t3. The waveforms of the conventional SSCB structure are shown as a solid line in time periods from t3 to t5, and the waveforms of the present disclosure enhanced SSCB structure are shown as a dashed line in time periods from t3 to t5.

As can be seen in FIG. 4, the conventional SSCB structure transitions from a peak current value ($i_{peak}$) to a zero value in the time period from t3 to t4. In contrast, the present enhanced SSCB structure 20 transitions from the peak current value ($i_{peak}$) to a zero value in the greater time period from t3 to t5 ([t3 to t5]>[t3 to t4]). The conventional SSCB structure produces a larger di/dt in the time period from t3 to t4 than the di/dt produced by the enhanced SSCB structure in the time period (t3 to t5); $(di/dt)_{conv} > (di/dt)_{enhanced}$. It should be noted that in the diagrammatic graph shown in FIG. 4, the conventional current waveform from t3 to t4 and the enhanced current waveform from t3 to t5 are shown as linear and therefore having constant respective di/dt values. In some applications, the respective current waveforms may not be entirely linear but may be construed to have a collective di/dt.

In the time period from t3 to t4, the gate voltage ($V_{gs}$) in the conventional SSCB structure decreases from the Miller plateau voltage ($V_m$) to the threshold voltage (Vth). Once the threshold voltage (Vth) is reached at t4, the power die in the conventional SSCB structure has fully switched to an OFF state, and the fault current (i) is broken. In contrast, the gate voltage ($V_{gs}$) in the enhanced SSBC structure 20 decreases but does not reach the threshold voltage (Vth) until t5. Hence, the power die in the conventional SSCB structure will switch to an OFF state in less time than power die in the enhanced SSCB structure 20.

As can be seen in FIG. 4, the drain voltage ($V_{ds}$) of the conventional SSCB structure and the enhanced SSCB structure 20 both continue to increase after t3—the point at which the peak current ($i_{peak}$) is reached. The increase in drain voltage ($V_{ds}$) for the conventional SSCB structure is attributable to inductance ($L_{di/dt}$) associated with the change in source current (i) as a function of time (di/dt). As can be seen in FIG. 4, the increase in drain voltage (Vas) for the conventional SSCB structure increases between t3 and t4, and peaks at t4. The increase in drain voltage (Vas) for the enhanced SSCB structure 20 is attributable two independent inductances—the inductance ($L_{di/dt}$) associated with the change in source current (i) and an inductance ($L_{sk}$) associated with the magnetic body 28. As can be seen in FIG. 4, the increase in drain voltage (Vas) for the enhanced SSCB structure 20 increases between t3 and t5, and peaks at t5. It can also be seen that the drain voltage (Vas) for the enhanced SSCB structure 20 increases at a slower rate than that of the conventional SSCB structure, and reaches a $V_{ds}$ peak value at t5 that is less than the Vas peak value reached by the conventional SSCB structure at t4. Hence, the enhanced SSCB structure 20 produces a maximum overvoltage ($V_{over-enhanced}$) that is lesser in magnitude than the maximum overvoltage ($V_{over-com}$) produced by the conventional SSCB structure.

FIG. 4 illustrates a counteracting voltage ($V_{sk}$) that is in series with the source current (i). The counteracting voltage ($V_{sk}$) is associated (at least in part) with the inductance produced by the change in current ($L_{di/dt}$). With respect to the conventional SSCB structure, the counteracting voltage ($V_{sk}$) is primarily attributable to the change of current inductance ($L_{di/dt}$). FIG. 4 diagrammatically illustrates the counteracting voltage ($V_{sk}$) as a negative voltage in the time period between t3 and t4 that coincides with the change in source current (di/dt) for the conventional SSCB structure. The counteracting voltage ($V_{sk}$) acts against the gate voltage ($V_{gs}$). As a result, the gate voltage is reduced by the counteracting voltage ($V_{gs}$ becomes $V_{gs\text{-}effective}=V_{gs}\text{-}V_{sk}$) which causes the internal gate capacitors of the power die 22 to discharge slower than would occur in the absence of the inductance ($L_{di/dt}$). The slower discharge slows the rate of change in current (di/dt) which in turn decreases the drain voltage ($V_{ds}$) and the overvoltage.

With respect to the enhanced SSCB structure 20, the counteracting voltage ($V_{sk}$) is produced by the inductance associated with the change in source current as a function of time ($L_{di/dt}$) as well as the inductance ($L_{sk}$) associated with the magnetic body 28 resulting from the magnetic field acting on the bond wires 26. The enhanced SSCB structure 20 is configured such that the magnetic body 28 increases the total inductance (i.e., $L_{di/dt}+L_{sk}$), and thereby increases the counteracting voltage ($V_{sk}$). FIG. 4 diagrammatically illustrates the increase in counteracting voltage ($V_{sk}$) associated with the enhanced SSCB structure 20 as larger than that produced in the conventional SSCB structure and extending for the di/dt time period (t3-t5) of the enhanced SSCB structure 20. As indicated above, the counteracting voltage ($V_{sk}$) acts against the gate voltage ($V_{gs}$) and decreases the gate voltage ($V_{gs}$ becomes $V_{gs\text{-}effective}=V_{gs}\text{-}V_{sk}$). In the case of the enhanced SSCB structure 20, the larger counteracting voltage ($V_{sk}$) decreases the gate voltage more than the gate voltage decrease associated with the conventional SSCB structure. As a result, the discharge rate of the power die internal gate capacitors of the enhanced SSCB structure 20 is slower than the discharge rate associated with the conventional SSCB structure, which in turn slows the current rate of change (di/dt) more than that associated with conventional SSCB structure and decreases the drain voltage ($V_{ds}$) and the overvoltage.

As indicated above, the present disclosure contemplates different magnetic body 28 configurations and a magnetic body 28 may be specifically configured to produce a desirable inductance ($L_{sk}$) for the operation of a given power die 22, or a desirable inductance ($L_{sk}$) for the operation of a given power die 22 may be achieved by including more or less bond wire 26 turns around the magnetic body 28, or any combination thereof. The additional inductance ($L_{sk}$) provides the benefit of decreasing the overvoltage, but does so by increasing the di/dt period of time. The present disclosure provides a mechanism for tuning the operation of the SSCB structure for the application at hand.

Once the enhanced SSCB structure 20 reaches t5 and the fault current is broken, the enhanced SSCB structure 20 is ready to be turned on again. In some embodiments of the present disclosure enhanced SSCB structure 20, a voltage clamp may be used at the power die gate to protect the power die 22 against negative gate voltages that may occur.

FIG. 5 illustrates a non-limiting circuit implementation of a present disclosure enhanced SSCB structure 20; i.e., a circuit for limiting switching overvoltage. A source inductance ($L_s$) is disposed in-line between a first current contact (FCC) and the source contact (S) of a MOSFET. In this example, the MOSFET is an N-channel enhancement type MOSFET. An inductance ($L_{sk}$) associated with the magnetic body 28 is disposed in-line between the source inductance ($L_s$) and the source contact (S) of the MOSFET. Hence, the magnetic body inductance ($L_{sk}$) and the source inductance ($L_s$) are disposed in series. A first end of a gate driver loop is connected to the line extending between the first current contact source (FCC) and the source contact (S) of the MOSFET. A second end of a gate driver loop is connected to the MOSFET gate (G). The first end of the gate driver loop connects to the line between the magnetic body inductance ($L_{sk}$) and the source inductance ($L_s$). A voltage source ($V_{gd}$) shown as a pulsed voltage source for driving the MOSFET gate (G) is disposed in the gate driver loop between the first and second ends of the loop. In some embodiments, the gate driver loop may include a voltage clamp. A nonlimiting example of a voltage clamp that may be used is a Zener diode (ZD) disposed in parallel with the voltage source ($V_{gd}$). A gate resistance ($R_g$) and a gate inductance ($L_g$) are shown in series between the voltage source ($V_{gd}$) and the MOSFET gate (G), and more specifically between the voltage source ($V_{gd}$) and where the Zener diode (ZD) connects in parallel. A drain inductance ($L_d$) is shown disposed in series with the MOSFET drain (D) and a second current contact (SCC). As indicated above, the circuit implementation shown in FIG. 5 is a nonlimiting example provided to facilitate the description provided herein. The present disclosure is not limited to using a Zener diode or an N-channel enhancement type MOSFET.

The present disclosure enhanced SSCB structure can be configured to suit a number of different applications. For example, configuration variables such as the size of the magnetic body 28, the number of magnetic sheets within a magnetic body 28, the relative permeability of the magnetic body 28, the geometry of the bond wires 26 relative to magnetic body 28 (e.g., bond wires 26 that extend in proximity to the magnetic body 28 without a turn, or bond wires 26 that form one or more turns around the magnetic body 28) can be selected to produce an inductance ($L_{sk}$) that suits the application at hand. Furthermore, in an application wherein more than one power die 22 is included in the enhanced SSCB structure 20, the present disclosure permits each power die 22 to be individually configured for the application of that particular power die 22. As an example, a present disclosure enhanced SSCB structure 20 may be configured with a magnetic body 28 arrangement that increases the total inductance (i.e., $L_{di/dt}+L_{sk}$) by a factor in the range of five to ten times; i.e., the $L_{di/dt}+L_{sk}$ may be in the range of 5X –10X the source inductance ($L_{di/dt}$) of a conventional SSCB structure.

The present disclosure enhanced SSCB structure 20 also decreases the significance of the gate resistance ($R_g$) in the operation of the power die 22. As stated above, the inductance associated with the magnetic device ($L_{sk}$) is a factor in producing the counteracting voltage ($V_{sk}$) that decreases the effective gate voltage ($V_{gs\text{-}effective}=V_{gs}\text{-}V_{sk}$). The decreased gate voltage, in turn, facilitates using a smaller gate resistance ($R_g$) without an overvoltage ($V_{over}$) penalty like that produced by a conventional SSCB structure. The smaller gate resistance ($R_g$) also decreases the time to reach the Miller plateau. In some applications, embodiments of the present enhanced SSCB structure 20 may utilize a gate resistance ($R_g$) that is effectively zero or may permit the gate resistance to be completely eliminated.

While the principles of the disclosure have been described above in connection with specific apparatuses and methods, it is to be clearly understood that this description is made only by way of example and not as limitation on the scope of the disclosure. Specific details are given in the above description to provide a thorough understanding of the embodiments. However, it is understood that the embodiments may be practiced without these specific details.

It is noted that the embodiments may be described as a process which is depicted as a flowchart, a flow diagram, a block diagram, etc. Although any one of these structures may describe the operations as a sequential process, many of the operations can be performed in parallel or concurrently. In addition, the order of the operations may be rearranged. A process may correspond to a method, a function, a procedure, a subroutine, a subprogram, etc.

The singular forms "a," "an," and "the" refer to one or more than one, unless the context clearly dictates otherwise. For example, the term "comprising a specimen" includes single or plural specimens and is considered equivalent to the phrase "comprising at least one specimen." The term "or" refers to a single element of stated alternative elements or a combination of two or more elements unless the context clearly indicates otherwise. As used herein, "comprises" means "includes." Thus, "comprising A or B," means "including A or B, or A and B," without excluding additional elements.

It is noted that various connections are set forth between elements in the present description and drawings (the contents of which are included in this disclosure by way of reference). It is noted that these connections are general and, unless specified otherwise, may be direct or indirect and that this specification is not intended to be limiting in this respect. Any reference to attached, fixed, connected or the like may include permanent, removable, temporary, partial, full and/or any other possible attachment option.

No element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprise", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

While various inventive aspects, concepts and features of the disclosures may be described and illustrated herein as embodied in combination in the exemplary embodiments, these various aspects, concepts, and features may be used in many alternative embodiments, either individually or in various combinations and sub-combinations thereof. Unless expressly excluded herein all such combinations and sub-combinations are intended to be within the scope of the present application. Still further, while various alternative embodiments as to the various aspects, concepts, and features of the disclosures—such as alternative materials, structures, configurations, methods, devices, and components, and so on—may be described herein, such descriptions are not intended to be a complete or exhaustive list of available alternative embodiments, whether presently known or later developed. Those skilled in the art may readily adopt one or more of the inventive aspects, concepts, or features into additional embodiments and uses within the scope of the present application even if such embodiments are not expressly disclosed herein. For example, in the exemplary embodiments described above within the Detailed Description portion of the present specification, elements may be described as individual units and shown as independent of one another to facilitate the description. In alternative embodiments, such elements may be configured as combined elements. It is further noted that various method or process steps for embodiments of the present disclosure are described herein. The description may present method and/or process steps as a particular sequence. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the description should not be construed as a limitation.

The invention claimed is:

1. A solid state circuit breaker structure, comprising:
a power substrate;
a power die mounted on the power substrate;
a plurality of bond wires extending outwardly from the power die; and
a magnetic body attached to the power substrate and disposed to increase a magnetic field produced by a current flowing through the bond wires and thereby produce a first inductance that produces a decrease in an overvoltage at turn off of the power die.

2. The structure of claim 1, wherein the first inductance is in series with a source terminal of the power die.

3. The structure of claim 1, wherein the power die is a metal oxide semiconductor field effect transistor (MOSFET) having a gate terminal, a drain terminal, and a source terminal, and the source terminal of the power die is the source terminal of the MOSFET.

4. The structure of claim 3, wherein the MOSFET is an N-Channel enhancement type MOSFET.

5. The structure of claim 1, wherein the power die is an insulated gate bipolar transistor (IGBT) having a collector terminal, an emitter terminal, and a gate terminal, and the source terminal of the power die is the collector terminal of the IGBT.

6. The structure of claim 1, wherein the plurality of bond wires extend in close proximity to the magnetic body without extending around the magnetic body.

7. The structure of claim 1, wherein the plurality of bond wires extend at least one turn around the magnetic body.

8. The structure of claim 1, wherein the magnetic body includes a soft magnetic sheet.

9. The structure of claim 8, wherein the magnetic body has a relative permeability in the range of one to one hundred.

10. The structure of claim 9, wherein the magnetic body has a relative permeability in the range of sixty to ninety.

* * * * *